United States Patent
Mehrad et al.

(10) Patent No.: US 7,892,906 B2
(45) Date of Patent: Feb. 22, 2011

(54) METHOD FOR FORMING CMOS TRANSISTORS HAVING FUSI GATE ELECTRODES AND TARGETED WORK FUNCTIONS

(75) Inventors: Freidoon Mehrad, Plano, TX (US); Frank S. Johnson, Wappingers Falls, NY (US)

(73) Assignee: Texas Instruments Incorporated, Dallas, TX (US)

( * ) Notice: Subject to any disclaimer, the term of this patent is extended or adjusted under 35 U.S.C. 154(b) by 604 days.

(21) Appl. No.: 12/022,488

(22) Filed: Jan. 30, 2008

(65) Prior Publication Data

US 2009/0191675 A1 Jul. 30, 2009

(51) Int. Cl.
*H01L 21/8234* (2006.01)
(52) U.S. Cl. .................................. 438/199
(58) Field of Classification Search ........... 438/199, 438/233
See application file for complete search history.

(56) References Cited

U.S. PATENT DOCUMENTS

2005/0095825 A1* 5/2005 Saito et al. .............. 438/527
2005/0263824 A1* 12/2005 Nakajima ................. 257/369
2006/0148181 A1* 7/2006 Chan et al. ................ 438/289
2006/0160290 A1* 7/2006 Chong et al. .............. 438/199
2007/0026600 A1* 2/2007 Komori .................... 438/199
2008/0224239 A1* 9/2008 Lin et al. .................. 257/411

OTHER PUBLICATIONS

U.S. Appl. No. 11/694,662, filed Mar. 30, 2007, Manfred Ramin et al.

* cited by examiner

*Primary Examiner*—N Drew Richards
*Assistant Examiner*—Grant S Withers
(74) *Attorney, Agent, or Firm*—Rose Alyssa Keagy; Wade J. Brady, III; Frederick J. Telecky, Jr.

(57) ABSTRACT

A method for making CMOS transistors that includes forming a NMOS transistor and a PMOS transistor having an undoped polysilicon gate electrode and a hardmask. The method also includes forming a layer of insulating material and then removing the hardmasks and a portion of the layer of insulating material. A layer of silicidation metal is formed and a first silicide anneal changes the undoped polysilicon gate electrodes into partially silicided gate electrodes. Dopants of a first type and a second type are implanted into the partially silicided gate electrode of the PMOS and NMOS transistors and a second silicide anneal is performed to change the doped partially silicided gate electrodes into fully silicided gate electrodes.

24 Claims, 14 Drawing Sheets

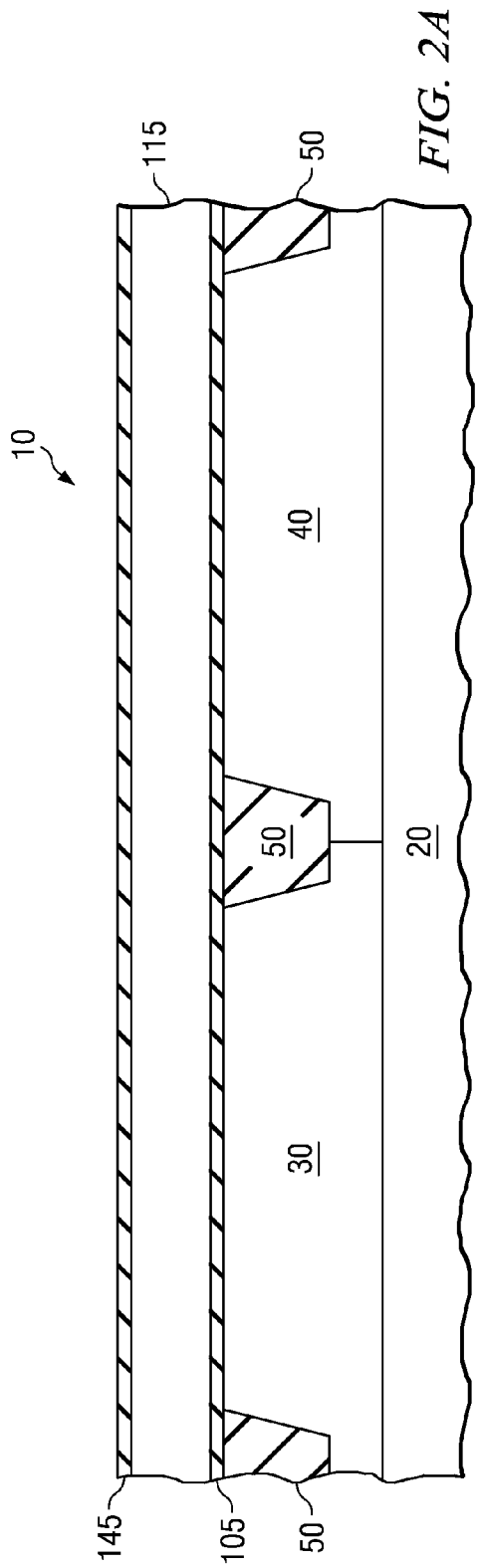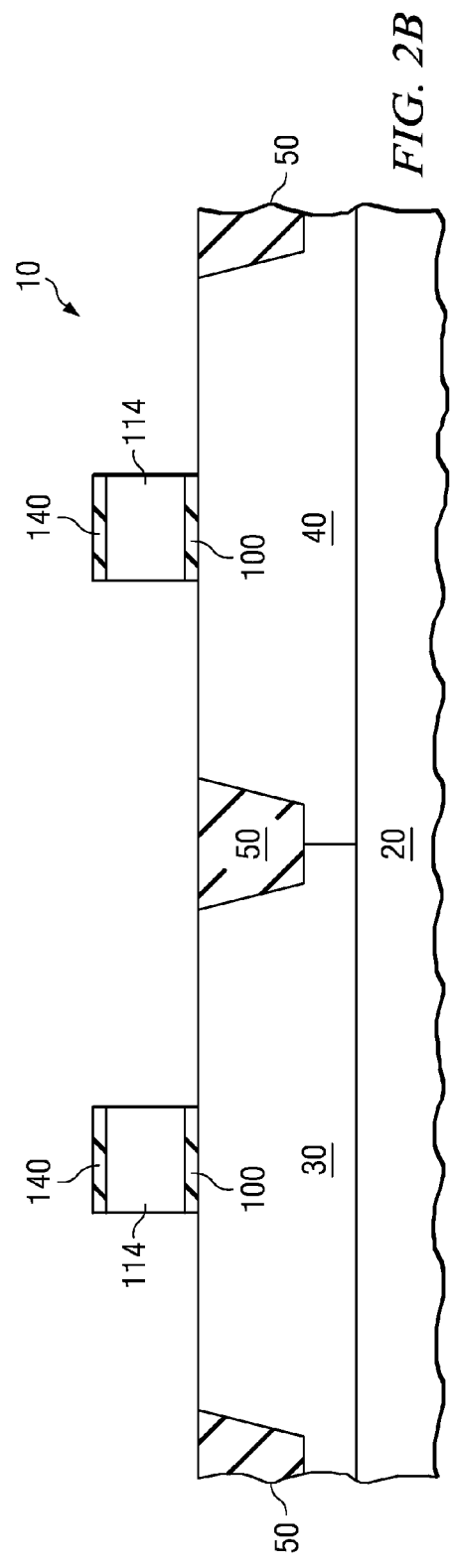

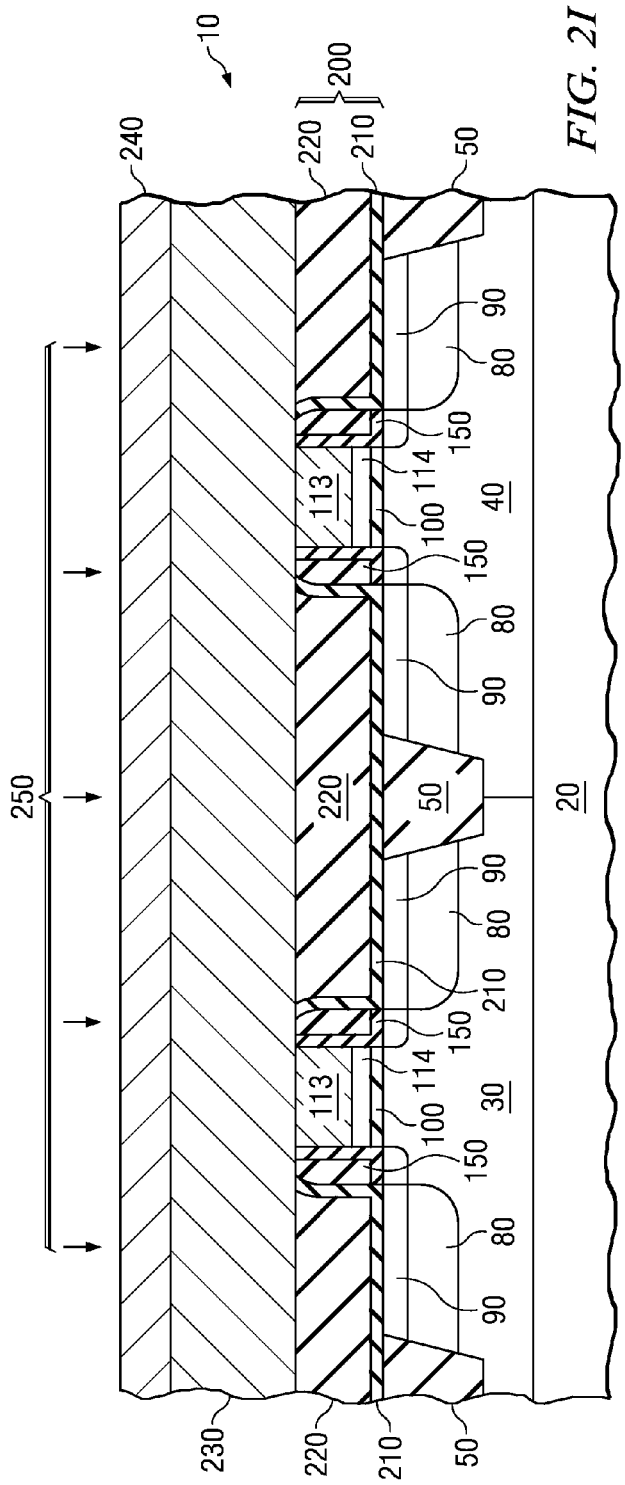
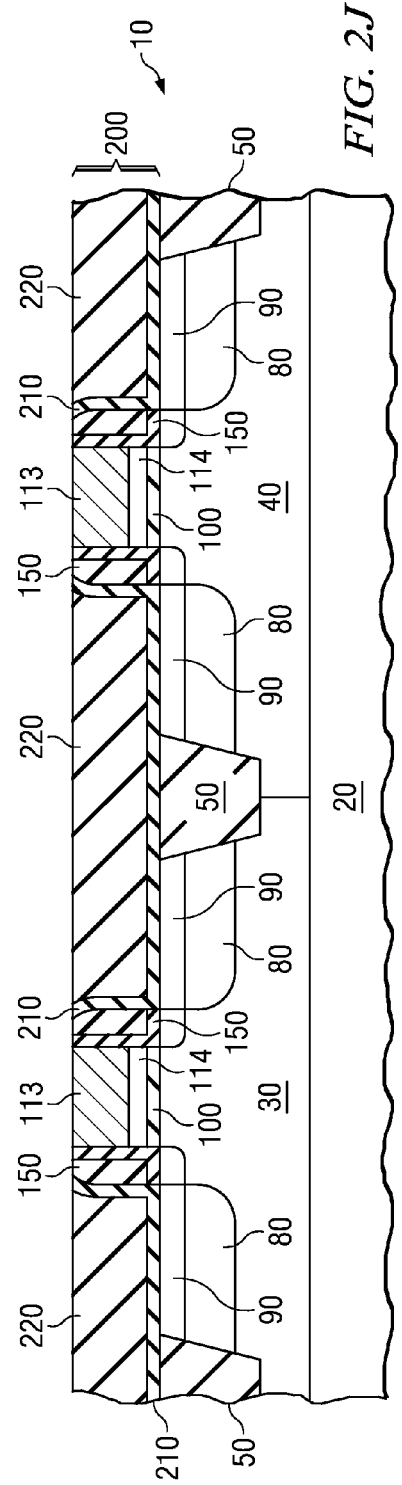

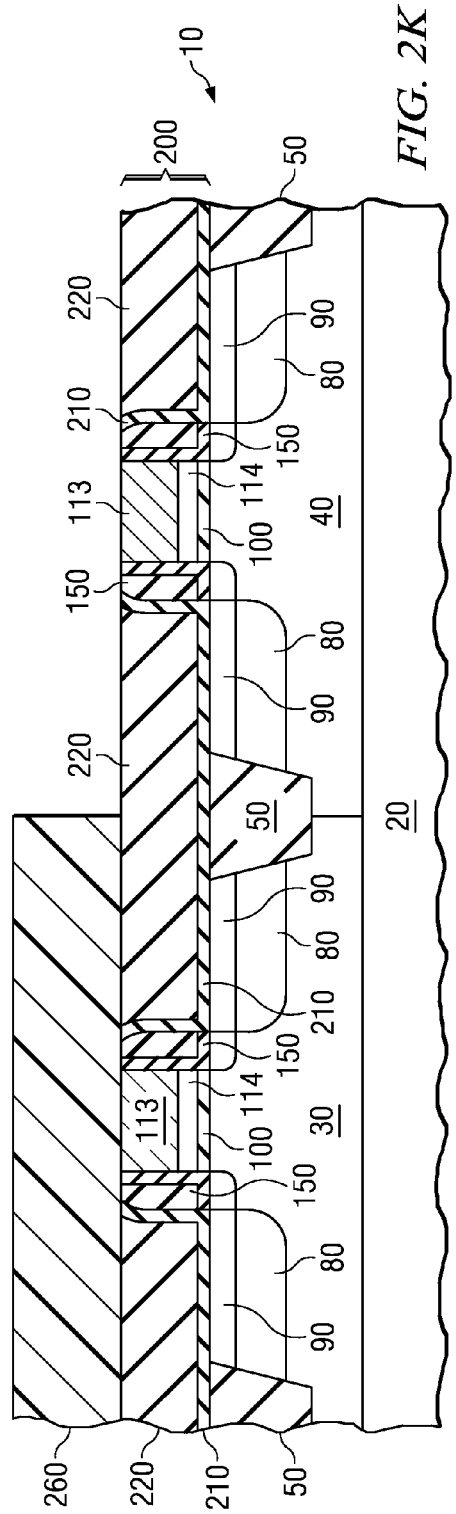
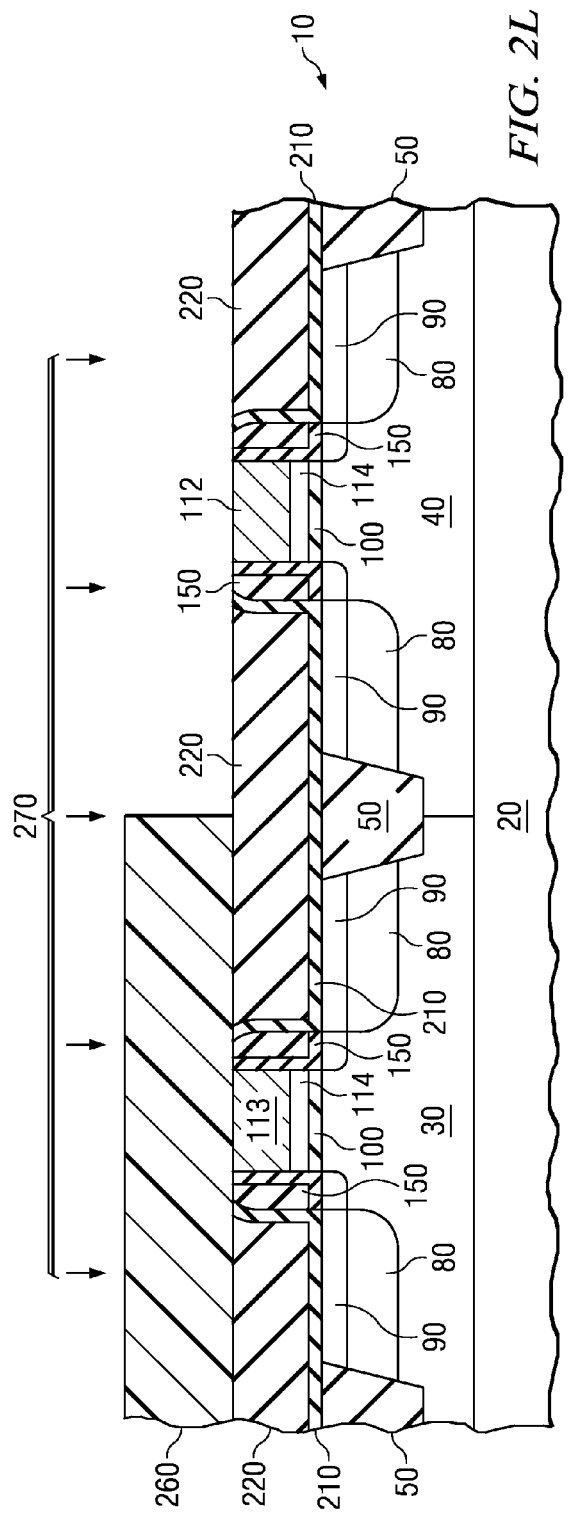

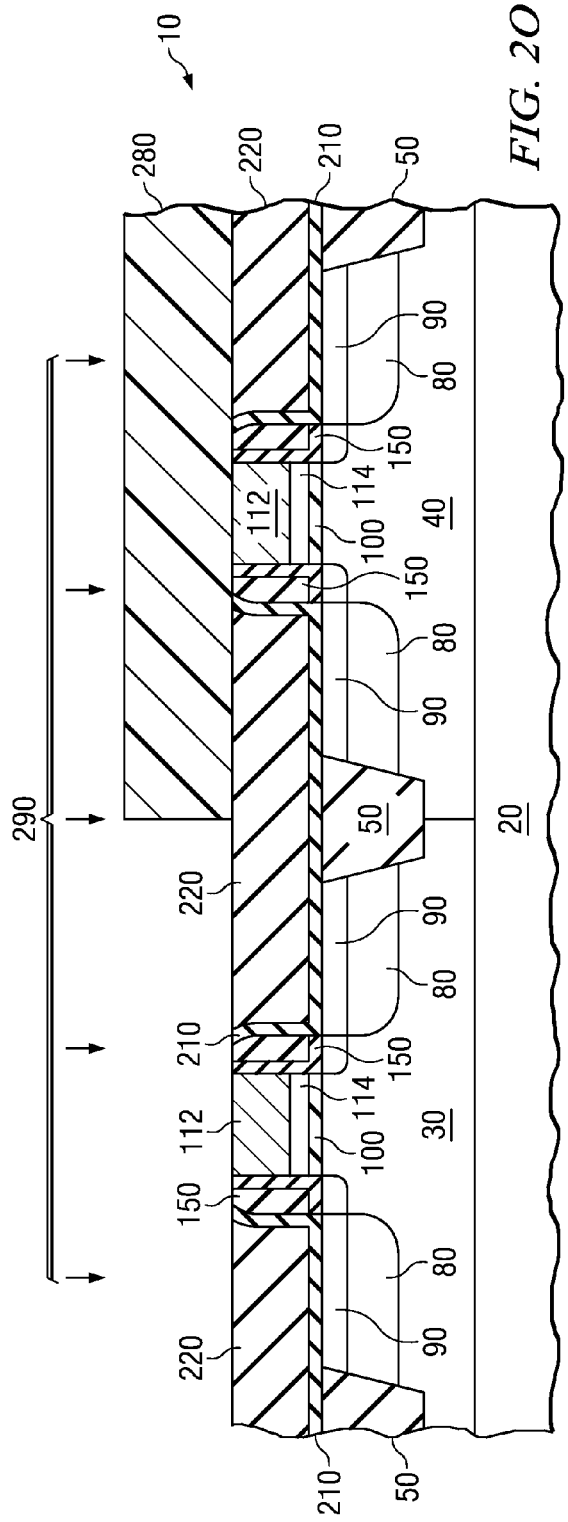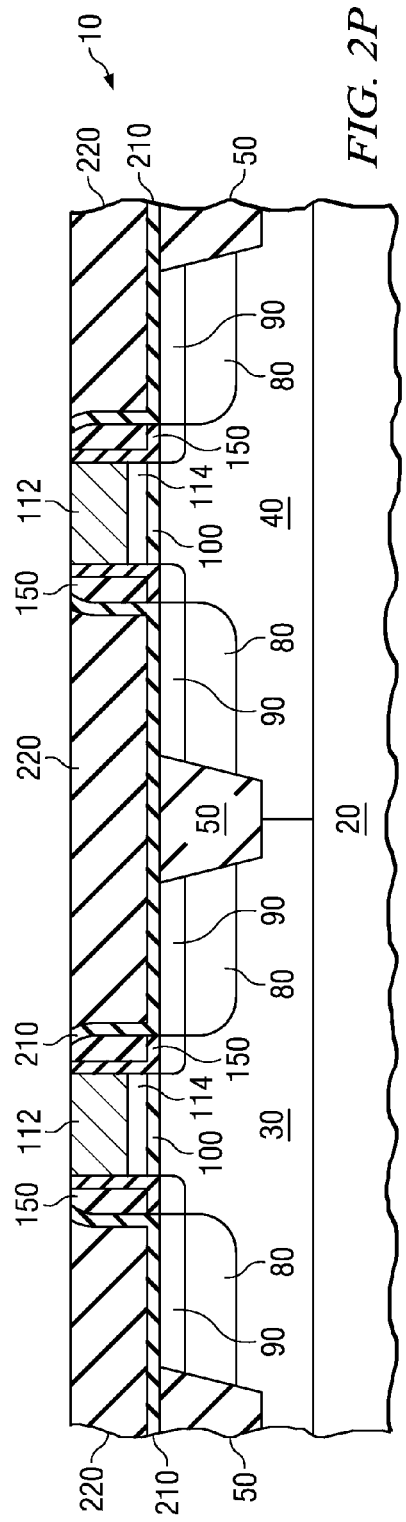

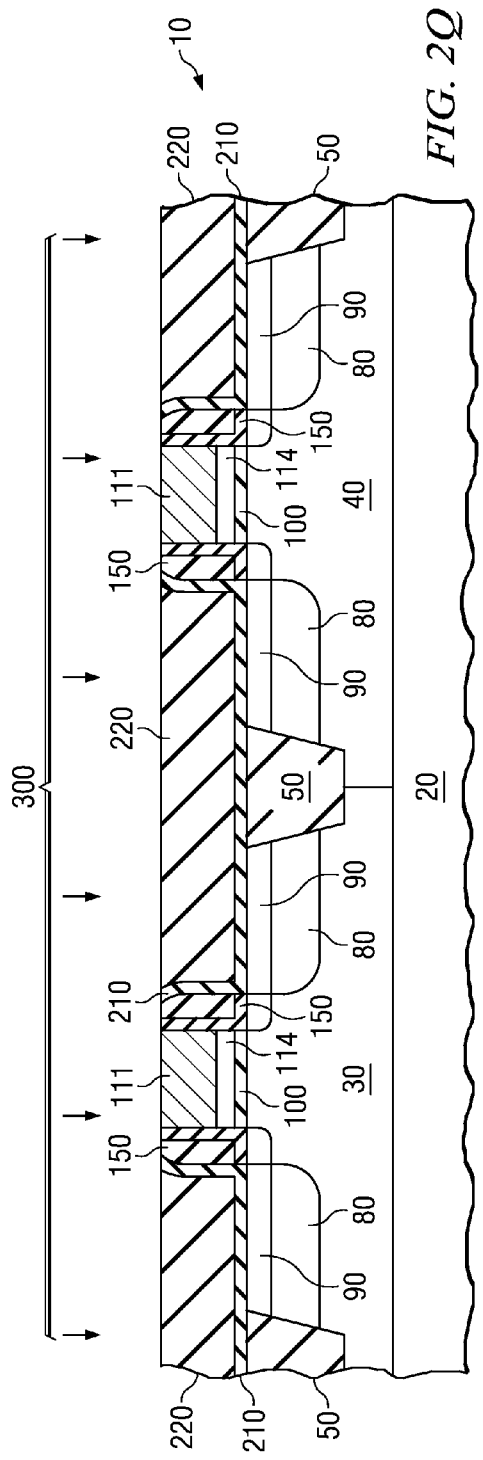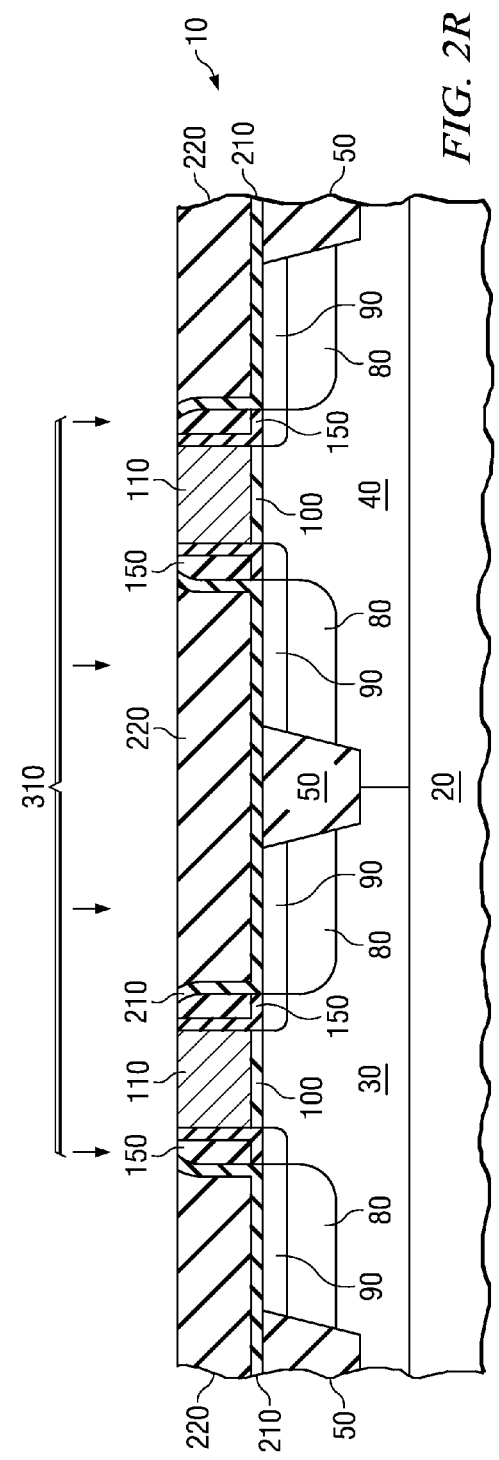

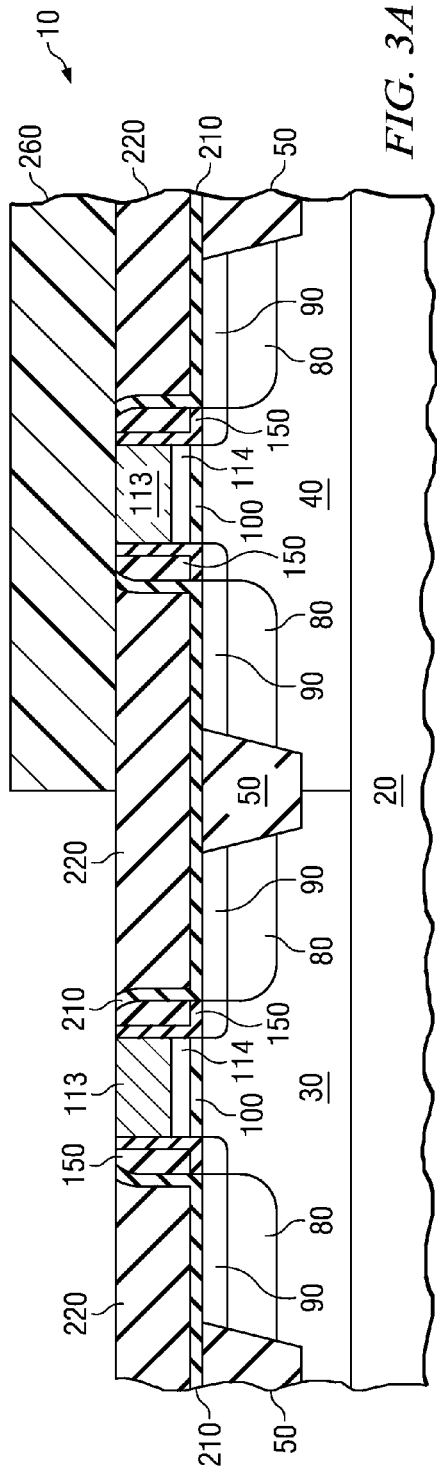
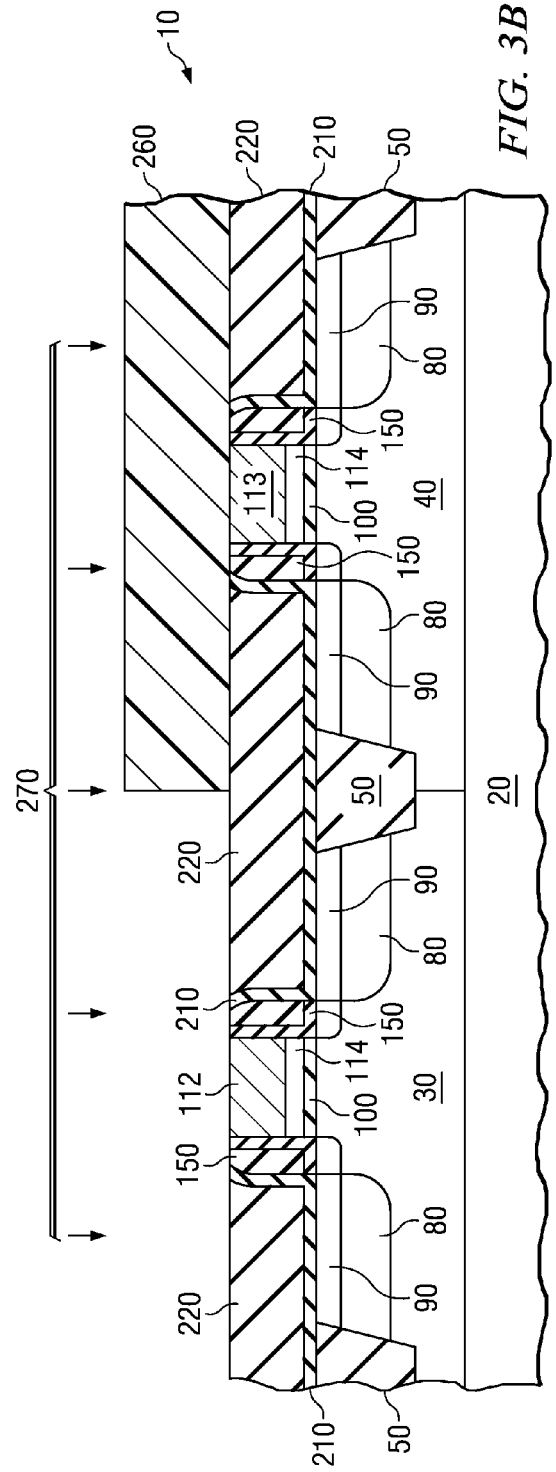
FIG. 3A
FIG. 3B

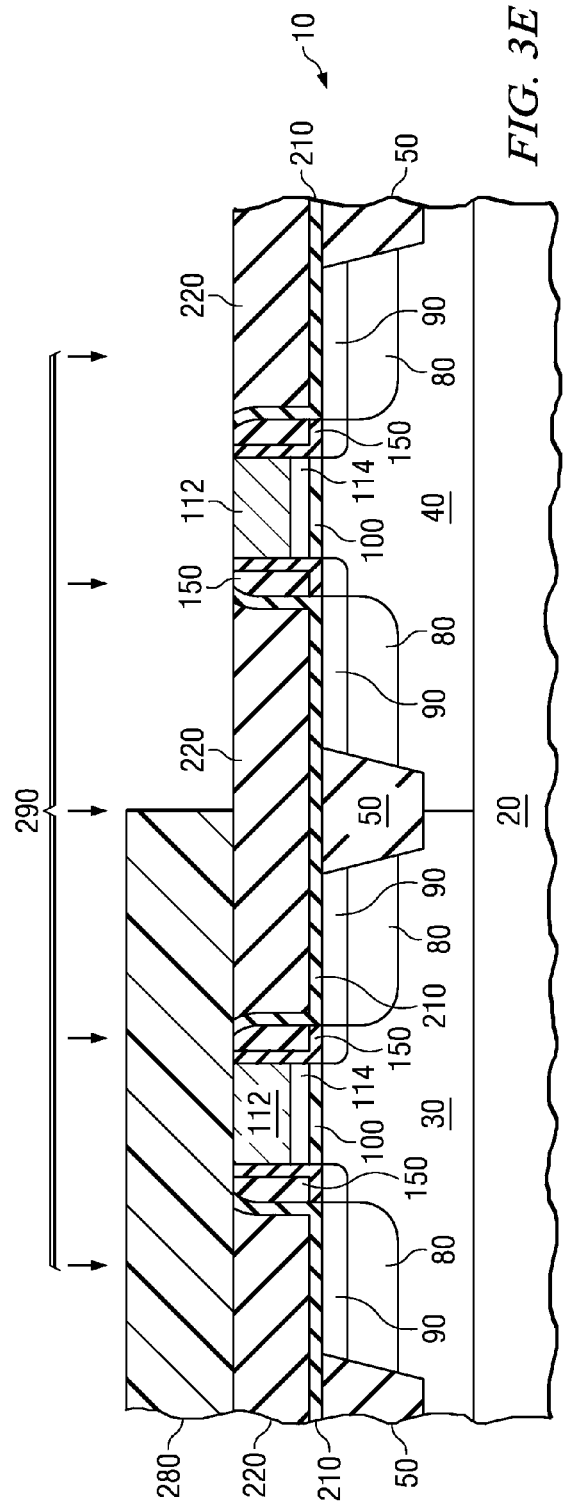
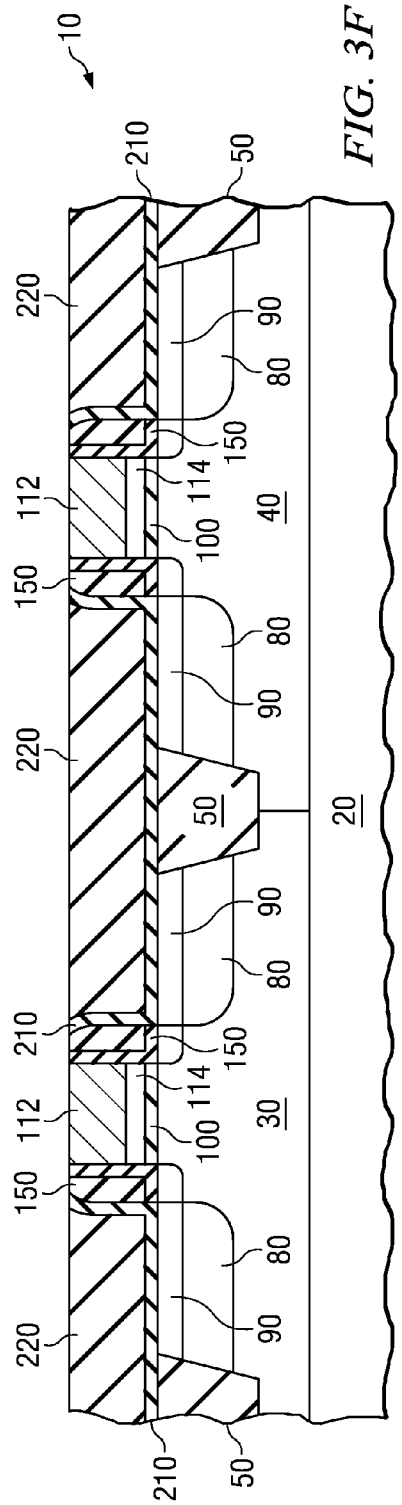

US 7,892,906 B2

METHOD FOR FORMING CMOS TRANSISTORS HAVING FUSI GATE ELECTRODES AND TARGETED WORK FUNCTIONS

BACKGROUND OF THE INVENTION

This invention relates to a method of fabricating NMOS and PMOS transistors that have fully silicided ("FUSI") gate electrodes.

BRIEF DESCRIPTION OF THE DRAWINGS

FIGS. 3A-3F are cross-sectional diagrams of a portion of a process for forming a PMOS transistor and an NMOS transistor in accordance with an alternative embodiment of the invention.

DETAILED DESCRIPTION OF THE INVENTION

Figure 1:
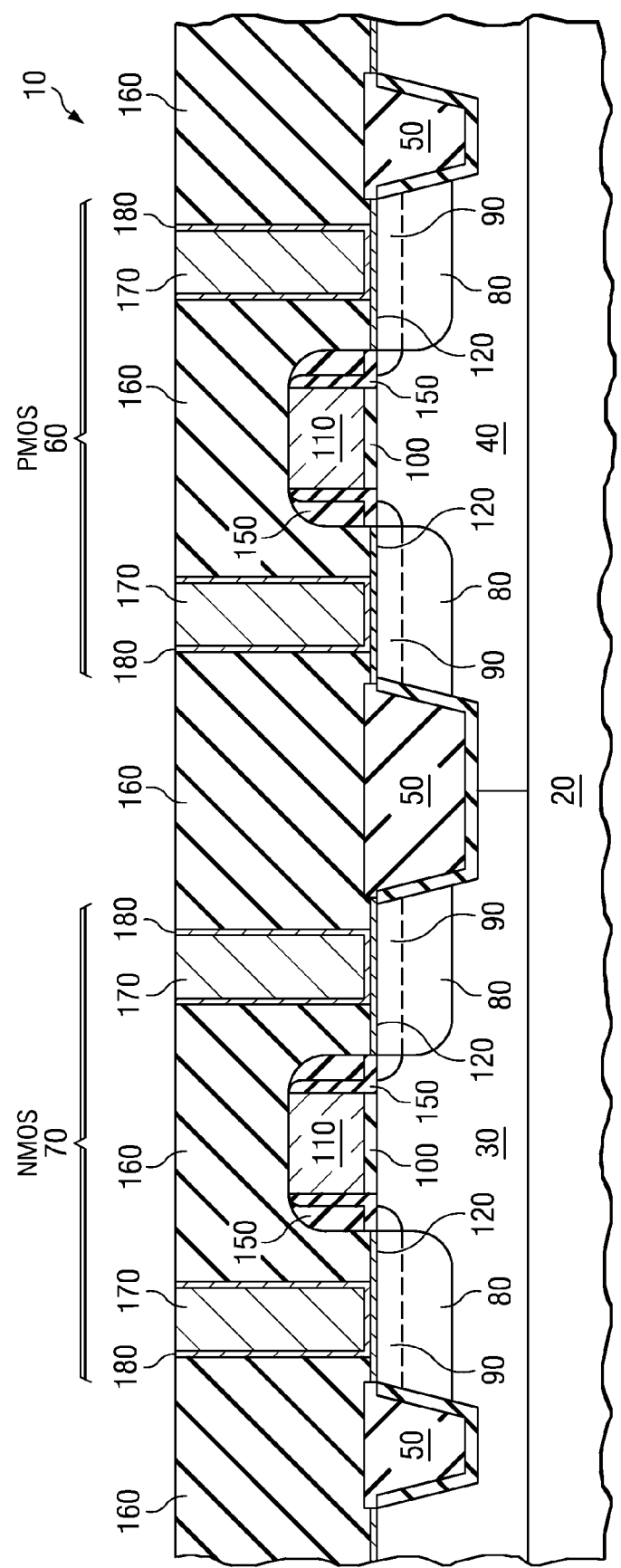
FIG. 1 is a cross-sectional view of a semiconductor structure in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a semiconductor wafer 10 in accordance with the present invention. In the example application, CMOS transistors 60, 70 are formed within a semiconductor substrate 20 having a p-well 30 containing the NMOS transistor 70 and an n-well 40 containing PMOS transistor 60.

The CMOS transistors 60, 70 are electrically insulated from other active devices located within the semiconductor wafer 10 (not shown) by shallow trench isolation structures 50 formed within the semiconductor substrate 20; however, any conventional isolation structure may be used such as field oxide regions or implanted isolation regions. The semiconductor substrate 20 may be a single-crystalline substrate that is doped with n-type and p-type dopants; however, it may also be silicon germanium ("SiGe") substrate, a silicon-on-insulator ("SOI") substrate, or a single-crystalline substrate having an epitaxial silicon layer that is doped with n-type and p-type dopants.

Transistors, such as CMOS transistors 60, 70, are generally comprised of a gate, source, and drain. More specifically, as shown in FIG. 1, the active portion of the CMOS transistors are comprised of source/drain regions 80, source/drain extension regions 90, and a gate stack that is comprised of a gate dielectric 100 and gate electrode 110.

The example PMOS transistor 60 is a p-channel MOS transistor. Therefore it is formed within an n-well region 40 of the semiconductor substrate 20. In addition, the deep source/drain regions 80 and the extension regions 90 have p-type dopants, such as boron. The extension regions 90 may be lightly doped ("LDD"), medium doped ("MDD"), or highly doped ("HDD"). However, sources/drain regions 80 are usually heavily doped. The PMOS gate stack is initially comprised of an undoped polysilicon electrode 114 and gate oxide dielectric 100. Subsequent fabrication steps (described below) convert the polysilicon electrode 114 to a partially silicided gate electrode 113, then adds dopants to the partially silicided gate electrode 113 to form a PMOS gate electrode 112 having an adjusted work function, and then converts the doped partially silicided gate electrode 112 (or 111) to a fully silicided ("FUSI") gate electrode 110.

The example NMOS transistor 70 is an n-channel MOS transistor. Therefore it is formed within a p-well region 30 of the semiconductor substrate 20. In addition, the deep sources and drains 80 and the source and drain extensions 90 have n-type dopants such as arsenic, phosphorous, antimony, or a combination of n-type dopants. The extension regions 90 may be LDD, MDD, or HDD. However, sources/drain regions 80 are usually heavily doped. The NMOS gate stack is initially comprised of an undoped polysilicon electrode 114 and gate oxide dielectric 100. Subsequent fabrication steps convert the undoped polysilicon electrode 114 to a partially silicided gate electrode 113, adds dopants to the partially silicided gate electrode 113 form a PMOS gate electrode 112 having an adjusted work function, and converts the doped partially silicided gate electrode 112 (or 111) to a FUSI gate electrode 110.

An offset structure comprising source/drain sidewalls 150 is used during fabrication to enable the proper placement of the source/drain regions 80. More specifically, the sources/drain regions 80 are formed with the gate stack and source/drain sidewalls 150 as a mask. The extension regions 90 are formed with the gate stack as a mask in the example embodiment. However, it is within the scope of the invention to form the extension regions 90 using the gate stack plus extension sidewalls that are located proximate the gate stack (not shown) as a mask.

The sources/drain regions 80 have a layer of silicide 120 that is formed within the top surface of the sources/drain regions 80 during the fabrication process. The silicide layer 120 formed within the top surface of the sources/drain regions 80 is preferably NiSi or $Ni_2Si$; however, it is within the scope of the invention to fabricate the silicide 120 with other metals (such as cobalt, platinum, titanium, tantalum, molybdenum, tungsten, or alloys of these metals). In the example application, the silicide layer 120 that is formed on the top surface of the sources/drain regions 80 is a self-aligned silicide (i.e. a "salicide"). More specifically, the source/drain silicide layer 120 is NiSi, $Ni_2Si$, or other Ni rich phase of nickel silicide for PMOS transistors 60 and NiSi for NMOS transistors 70. However, where a single electrode phase is used in both electrodes, then a Ni rich or NiSi silicide is formed in both (NMOS and PMOS) transistors.

The gate electrode 110 is also silicided during the semiconductor fabrication process (as described below). The FUSI gate electrode 110 is preferably comprised of NiSi or $Ni_2Si$; however, other metals may be used, such as cobalt, platinum, titanium, tantalum, molybdenum, tungsten, or an alloy. In addition, the FUSI gate electrodes 110 are doped to create NMOS transistors 70 and PMOS transistors 60 having separately optimized work functions (as also described below). In the example application shown in FIG. 1, the FUSI gate electrode 110 of the NMOS transistor 70 is doped with an element, such as Yb (ytterbium) or Sb (antimony), to shift the work function of the NMOS transistor 70. Similarly, the FUSI gate electrode 110 of the PMOS transistor 60 is doped with an element, such as Ga (gallium) or B (boron), to shift the work function of the PMOS transistor 60. The purpose of the silicide formed within the gate electrode 110 and the top portion 120 of the sources/drain regions 80 is the reduction of the contact resistance between the transistors 60, 70 and the electrical contacts 170, 180. Moreover, the purpose of the work function implant into the gate electrode 110 is the realization of targeted threshold voltages.

A layer of dielectric insulation 160 surrounds the transistors 60, 70. The composition of dielectric insulation 160 may be any suitable material such as $SiO_2$, tetraethylorthosilicate ("TEOS"), or organosilicate glass ("OSG"). The dielectric material 160 electrically insulates the metal contacts 170 (and contact liners 180) that electrically connect the CMOS transistors 60, 70 to other active or passive devices (not shown) that are located throughout the semiconductor wafer 10. An optional dielectric liner (not shown in FIG. 1) may be formed before the placement of the dielectric insulation layer 160. If used, the dielectric liner may be any suitable material such as silicon nitride.

In this example application, the contacts 170 are comprised of W; however, any suitable material (such as Cu, Ti, Al, or an alloy) may be used. In addition, an optional liner material 180 such as Ti, TiN, or Ta (or any combination or layer stack thereof) may be used to reduce the contact resistance at the interface between the contacts 170 and the selected FUSI gate electrode 110 or silicided sources/drain regions 80, 120.

Subsequent fabrication processes will create the "backend" portion of the integrated circuit (not shown). The backend generally contains one or more interconnect layers (and possibly via layers) that properly route electrical signals and power though out the completed integrated circuit.

Figure 2C:
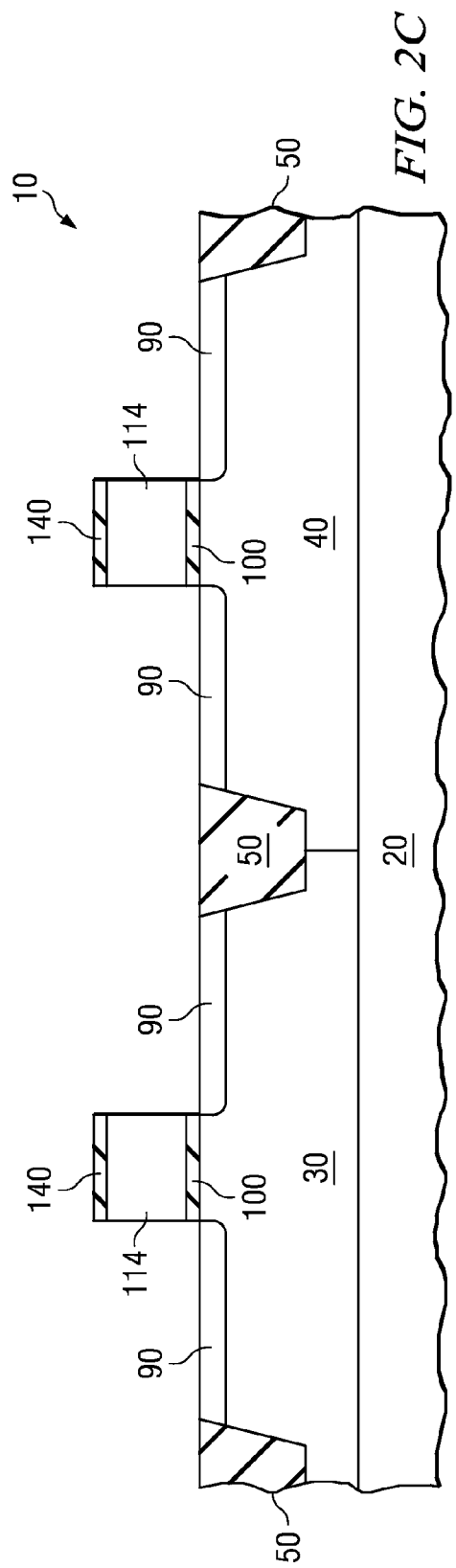
FIGS. 2A-2S are cross-sectional diagrams of a process for forming a PMOS transistor and an NMOS transistor in accordance with an embodiment of the invention.
Figure 2D:
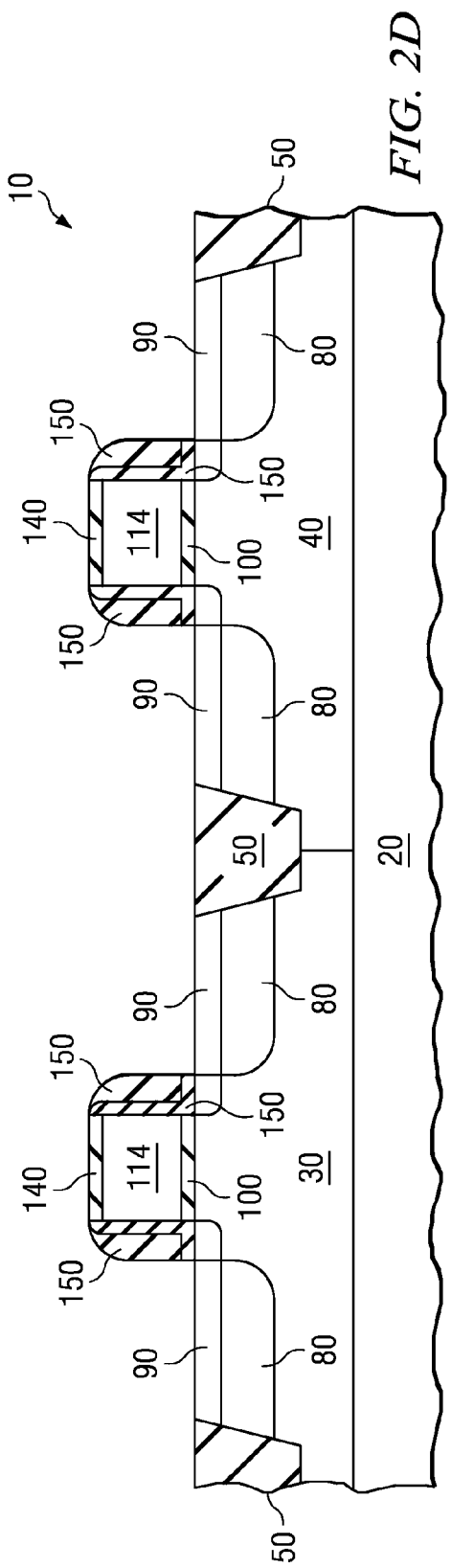
Figure 2E:
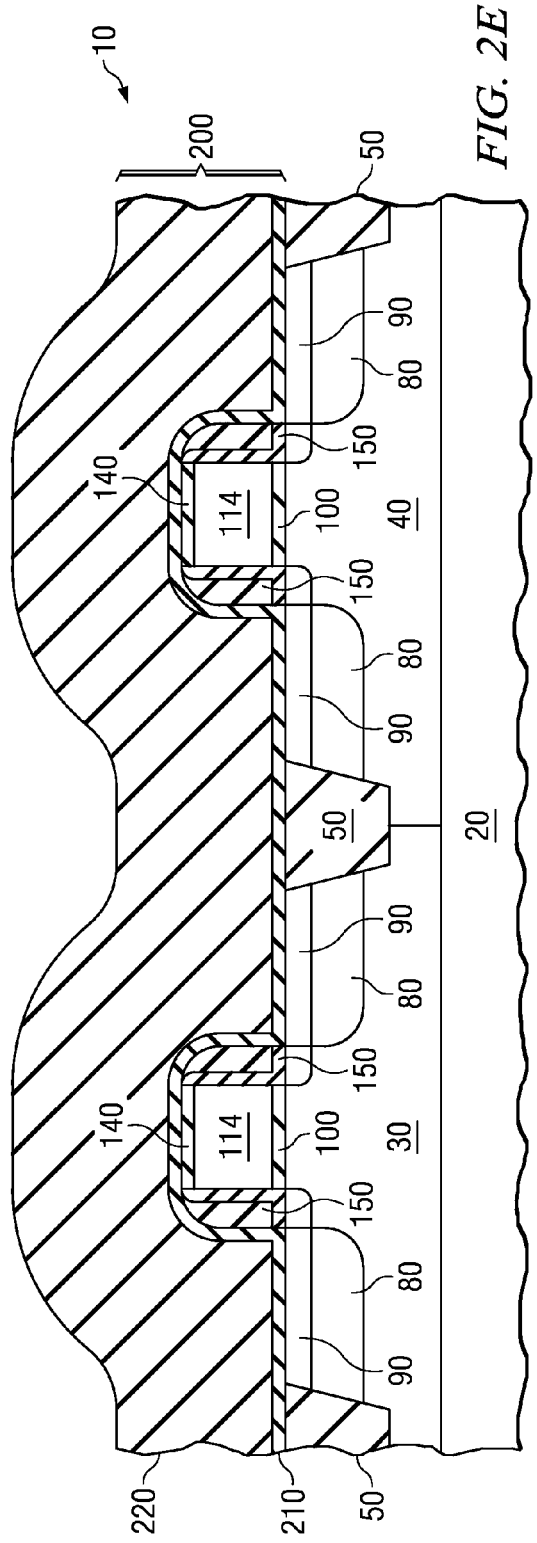
Figure 2F:
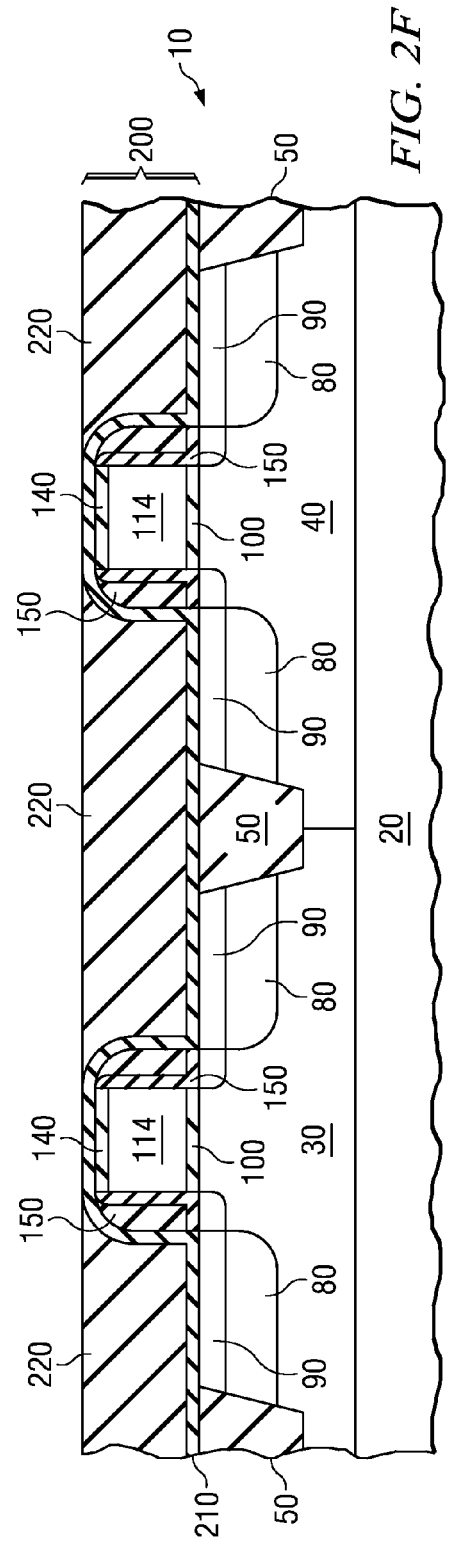
Figure 2G:
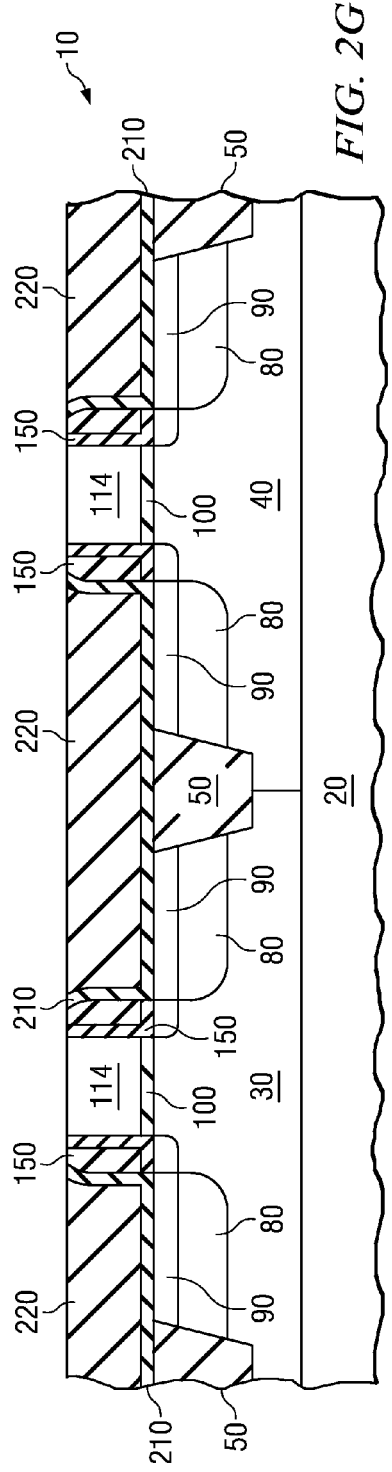
Figure 2H:
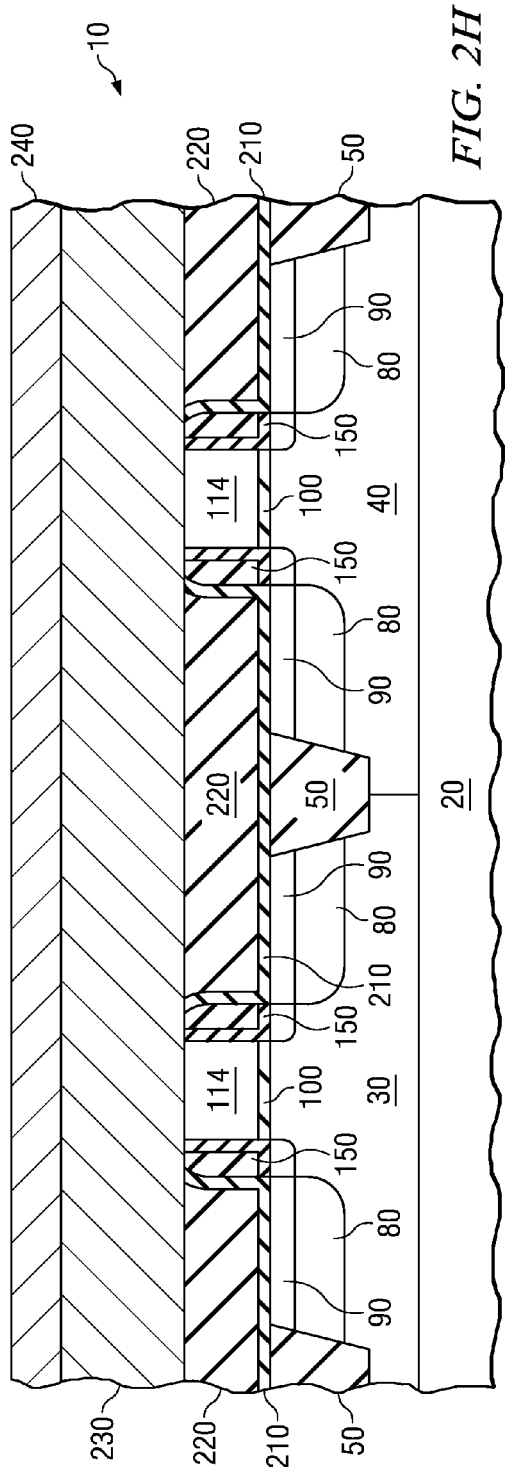
Figure 2M:
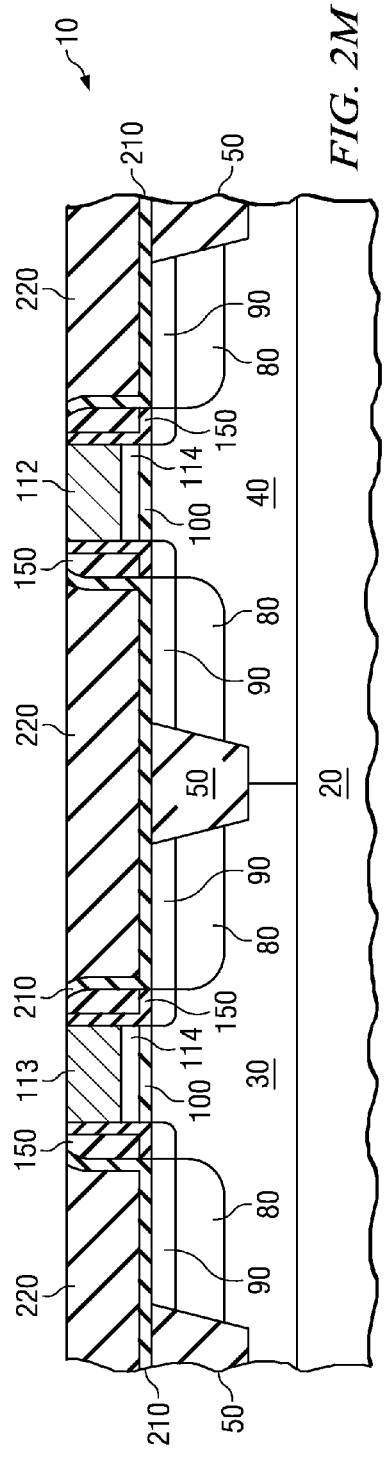
Figure 2N:
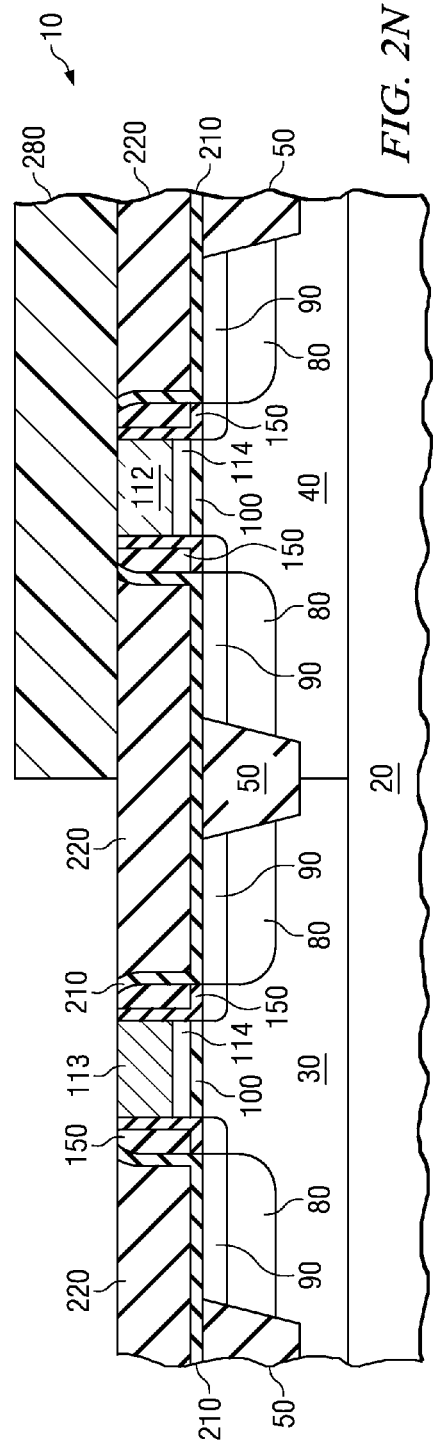
Figure 2S:
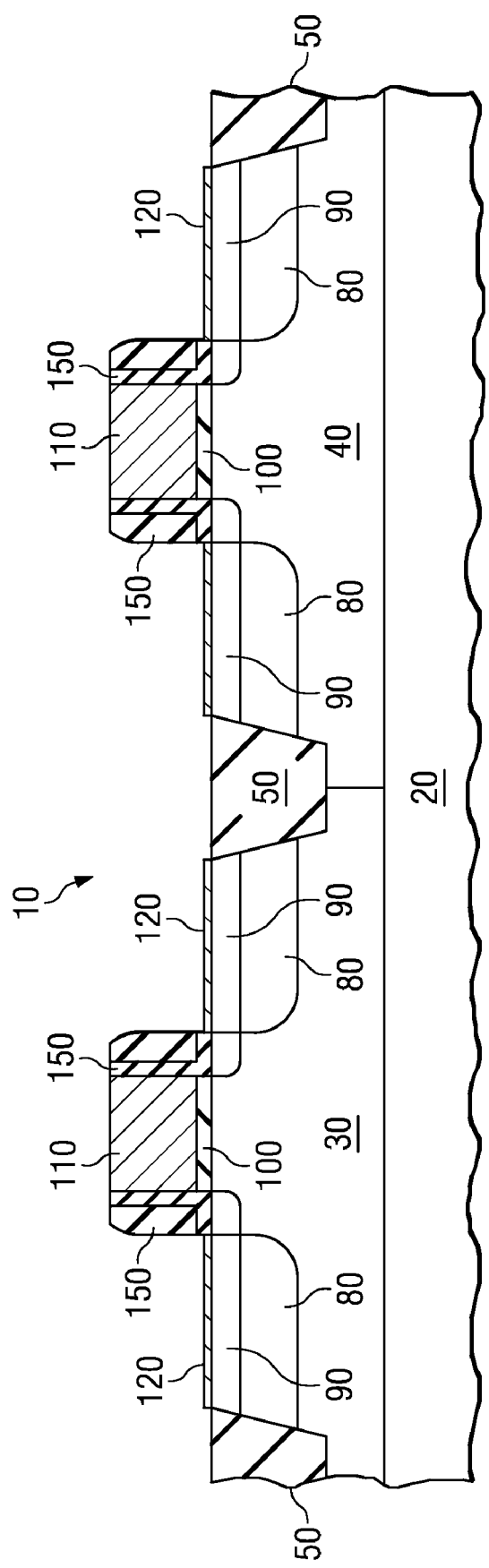

Referring again to the drawings, FIGS. 2A-2S are cross-sectional views of a partially fabricated semiconductor wafer 10 illustrating a process for forming an example PMOS transistor 60 and NMOS transistor 70 in accordance with the present invention. The following example application is exemplary but not restrictive of alternative ways of implementing the principles of the invention. Moreover, features and procedures whose implementations are well known to those skilled in the art are omitted for brevity. For example, the implementation of common fabrication steps lies within the ability of those skilled in the art and accordingly any detailed discussion thereof may be omitted.

FIG. 2A is a cross-sectional view of the semiconductor wafer 10 after the formation of the gate oxide layer 105 and the gate polysilicon layer 115 on the top surface of a semiconductor substrate 20. In the example application, the semiconductor substrate 20 is silicon; however any suitable material such as germanium or gallium arsenide may be used. The semiconductor substrate 20 contains a p-well 30 for the NMOS transistor 70 and an n-well 40 for the PMOS transistor 60. In addition, the semiconductor substrate 20 contains shallow trench isolation structures 50 that are formed using any suitable standard process.

The gate oxide layer 105 and the gate polysilicon layer 115 are formed using well-known manufacturing techniques. The first layer formed over the surface of the semiconductor substrate 20 is a gate dielectric oxide layer 105. In the example application, the gate dielectric layer 105 is a layer of silicon dioxide that is 10-50 Å thick. However, the gate dielectric layer 105 may be any suitable material, such as plasma nitrided silicon oxide, silicon nitride, or a high-k gate dielectric material. The gate dielectric layer 105 is formed with a thermal oxidation process but it may be formed using any one of a variety of standard processes such as an oxidation process, thermal nitridation, atomic layer deposition ("ALD"), plasma nitridation, physical vapor deposition ("PVD"), or chemical vapor deposition ("CVD").

A gate electrode polysilicon layer 115 is then formed on the surface of the gate dielectric layer 105. The gate electrode layer 115 is comprised of polycrystalline silicon and it is 400-1200 Å thick in the example application. However, it is within the scope of the invention to use other materials such as an amorphous silicon, a silicon alloy (e.g. SiGe), or other suitable materials. The gate electrode layer 115 may be formed using any standard process technique such as CVD or PVD.

In accordance with the example embodiment, a gate hardmask layer 145 is then formed on the surface of the gate electrode layer 115. The gate hardmask layer 145 is comprised of silicon oxynitride ("SiON") in the example application. However, it is within the scope of the invention to use other materials such as amorphous silicon, silicon-rich nitride ("SRN"), $SiO_2$, SiC, $S_xN_y$, TEOS, plasma tetra ethyl oxysilane ("PTEOS"), or a combinational stack of these materials. Preferably, the gate hardmask layer 145 is formed with a rapid thermal CVD ("RTCVD") process and the gate hardmask layer 145 is any suitable thickness, such as 100-600 Å. The purpose of the gate hardmask layer 145 is to protect the gate polysilicon layer 114 during the formation of the extension regions 90 and the source/drain regions 80 (described below).

After a pattern and etch process, a gate stack having a gate dielectric 100, a undoped polysilicon gate electrode 114, and a gate hardmask layer 140 will be formed from the gate oxide layer 105, the gate polysilicon layer 115, and the gate hardmask layer 145 respectively. This gate stack, shown in FIG. 2B, may be created through a variety of processes. For example, the gate stack may be created by forming a layer of photoresist over the semiconductor wafer, patterning the photoresist, and then using the photoresist pattern to etch the gate oxide layer 105, the undoped gate polysilicon layer 115, and the hardmask layer 145. The gate stack is etched using any suitable etch process, such as an anisotropic etch using plasma or reactive ions. The photoresist is then removed using any suitable ashing process.

The next step is the formation of the extension regions 90 using the gate stack as a template, as shown in FIG. 2C. The extension regions 90 are formed near the top surface of the semiconductor substrate 20 using any standard process. For example, the extension regions 90 may be formed by low-energy ion implantation, gas phase diffusion, or solid phase diffusion. The dopants used to create the extension regions 90 for a PMOS transistor 120 are p-type (i.e. boron). The dopants used to create the extension regions 90 for a NMOS transistor 70 are n-type (i.e. phosphorous or arsenic). However, other dopants or combinations of dopants may be used.

Alternatively, extension sidewalls (not shown) may be formed on the outer surface of the gate stack and used (along with the gate stack) as the mask to form the extension regions 90. If used, the extension sidewalls may be formed from a single material or may be formed from more than one layer of materials. For example, the extension sidewalls may be comprised of an oxide, oxi-nitride, silicon dioxide, nitride, or any other dielectric material or layers of dielectric materials. The material layers for the extension sidewalls may be formed with any suitable process, such as thermal oxidation, or deposition by ALD, CVD, or PVD. Preferably, at least one layer of the extension sidewall is comprised of a silicon nitride that is formed with a CVD process that uses a bis-t-butylaminosilane ("BTBAS") precursor. Forming the silicon nitride layer with that precursor will help guard against the etching of the extension sidewalls during the process of removing the gate hardmask layer later in the fabrication process (because of the low etch rate of BTBAS in the etching solution that is used for the hardmask layer removal).

At some point after the implantation of the extension regions 90, the extension regions 90 are activated by an anneal process (performed now or later). This anneal step may be performed with any suitable process such as rapid thermal anneal ("RTA").

It is within the scope of the embodiment to also form halo implant regions within the p-well 30 and the n-well 40 (not shown). The optional halo implants (sometimes called "pocket implants" or "punch through stoppers" because of their ability to stop punch through current) may be formed with any standard implant or diffusion process within (or proximate to) the extension regions 90.

Referring to FIG. 2D, source/drain sidewalls 150 are now formed proximate to the gate stack (or to the extension sidewalls, if used). The source/drain sidewalls 150 may be formed using any standard process and materials. The example source/drain sidewalls 150 may be comprised of a cap oxide and a silicon nitride layer that are formed with a CVD process and subsequently anisotropically etched (using standard anisotropic plasma etch processes). However, it is within the scope of the invention to use more layers (i.e. a spacer oxide layer, a silicon layer, and a final oxide layer) or less layers (i.e. just a silicon oxide layer or a silicon nitride layer) to create the source/drain sidewalls 150. Preferably, one layer of the source/drain sidewalls 150 is comprised of a silicon nitride that is formed with a CVD process that uses a BTBAS precursor to help guard against the etching of the source/drain sidewalls 150 during the process of removing the gate hardmask layer later in the fabrication process. It is to be noted that the semiconductor wafer 10 is usually subjected to a standard post-etch cleaning process after the formation of the source/drain sidewalls 150.

Now the source/drain sidewalls 150 (and the gate stack) are used as a template for the implantation of dopants into the source/drain regions 80 shown in FIG. 2D. The source/drain regions 80 may be formed through any one of a variety of processes, such as deep ion implantation or deep diffusion. The dopants used to create the source/drain regions 80 for a PMOS transistor 60 are typically boron; however, other dopants or combinations for dopants may be used. The dopants used to create the source/drain regions 80 for a NMOS transistor 70 are typically phosphorous or arsenic; however, other dopants or combinations for dopants may be used.

The implantation of the dopants is self-aligned with respect to the outer edges of the source/drain sidewalls 150. After the dopants are implanted, the source/drain regions 80 are activated by an anneal step. (However, the extension region anneal and the source/drain region anneal may be combined and performed at this point in the fabrication process.) This anneal step acts to repair the damage to the semiconductor wafer and to activate the dopants. The activation anneal may be performed by any suitable technique such as RTA (including spike anneal), flash lamp annealing ("FLA"), laser annealing, or a combination thereof. This anneal step often causes lateral and vertical migration of dopants in the extension regions 90 and the sources/drain regions 80 (not shown). In addition, this anneal step will cause the recrystallization of the ion implant areas 80, 90 (or the full crystallization of the ion implant areas 80, 90 if this is the first anneal).

It is to be noted that the gate hardmask 140 blocked the implantation of dopants into the undoped polysilicon electrode 114 during the implantation processes that were used to form the extension regions 90 and the source/drain regions 80. Specifically, the gate hardmask 140 stores the dopants that were directed to the gate electrode 114 and then those stored dopants are removed when the gate hardmask is removed (as described infra.).

The next step in the fabrication process is the preparation of the semiconductor wafer 10 for the silicidation of the PMOS and NMOS gate electrodes. Referring to FIG. 2E, a layer of insulating material 200 is now formed over the semiconductor wafer 10 to protect the source/drain regions 80 from the gate silicidation process. In the example embodiment, the layer of insulating material 200 is comprised of a thin conformal layer of silicon nitride 210 plus a thicker layer of silicon oxide 220 that is formed over the layer of silicon nitride 210; however, other insulating materials or combination of layers may be used. The silicon nitride layer 210 is preferably 20 Å to 100 Å thick and it is formed with any suitable process such as CVD or PVD. The silicon oxide layer 220 is preferably 1600 Å to 2200 Å thick and it is formed with any suitable process such as CVD or PVD.

A standard Chemical Mechanical Polish ("CMP"), which is selective to silicon nitride, is now performed. As shown in FIG. 2F, the CMP continues to planarize the oxide layer 220 until the portions of the silicon nitride layer 210 that are located over the gate hardmask 140 of the PMOS 60 and NMOS 70 transistors are exposed. However, it is within the scope of the invention to use any suitable alternative process (that is selective to silicon nitride) to expose the portions of the silicon nitride layer 210 that are located over the gate hardmasks 140.

As shown in FIG. 2G, the exposed portion of the silicon nitride layer 210 and the hardmasks 140 are now removed with any suitable process, such as a dry etch. Also as shown in FIG. 2G, the undoped polysilicon gate electrodes 114 of the PMOS transistor 60 and the NMOS 70 transistor are now exposed. A standard post dry etch clean (i.e. a SC1 clean) may be performed before the next step in the fabrication process.

As shown in FIG. 2H, a gate silicidation metal layer 230 is now formed over the semiconductor wafer 10. The silicidation metal layer 230 is preferably comprised of nickel; however, other suitable materials such as cobalt, platinum, titanium, tantalum, molybdenum, tungsten, or an alloy may be used. As it takes approximately 10 Å of nickel to fully silicidize approximately 18 Å of polysilicon, the thickness of the silicidation metal layer 230 should be at least 56% of the thickness of the undoped polysilicon gate electrode 114. To provide process margin, it is suggested that the thickness of the silicidation metal layer 230 should be at least 60% of the thickness of the undoped polysilicon gate electrode 114. In the example application, the silicidation metal layer 230 is approximately 800-1200 Å thick in order to fully silicidize the undoped polysilicon gate electrode 114.

An optional second layer 240 (that is often called the "cap layer") may also be formed over the metal layer 230. If used, the second layer 240 acts as a passivation layer that prevents the diffusion of oxygen from ambient into the metal layer 230. The second layer may be any suitable material, such as TiN or Ti. In the example application, the optional second layer 240 is between 100-300 Å thick.

As shown in FIG. 2I, the semiconductor wafer 10 is now subjected to a first silicide anneal with any suitable process 250. In the example application, the first silicide anneal is a low temperature spike anneal process. Suitable machines, such as the RadiancePlus (sold by Applied Materials) or the Summit (sold by Axcelis) may be used for the low temperature spike anneal process 250. For example, the low temperature spike anneal may be performed with a peak temperature less than 550° C. in a process ambient containing an inert gas such as N, He, or a combination of inert gases. Preferably, the time above $T_{peak}$ minus 50° C. is 10 seconds or less. The result of this process is an atomic ratio of reacted Ni to polysilicon of $\geq 1$ for the gate electrode 114. This first silicide anneal process 250 forms a nickel-rich gate silicide (i.e. $Ni_2Si$) 113 within the top 90-95% of the gate electrode 114. However, it is within the scope of the invention for the partially silicided gate electrodes 113 to be silicided to a depth of 85-95% from the surface of the electrodes. It is to be noted that the layer of silicidation metal 230 will not react with the sources/drains 80 because they are protected from silicidation process by the layer of insulating material 200.

The next step is the removal of the unreacted portions of the silicidation metal layer 230 and the cap layer 240 (if used), as shown in FIG. 2J. The silicidation metal layer 230 and the cap layer 240 are removed with any suitable process such as a selective wet etch process (i.e. using a fluid mixture of sulfuric acid, hydrogen peroxide, and water). The partially silicided gate electrodes 113 are now exposed and are therefore available for dopant implantation in order to tune the PMOS and NMOS transistors 60, 70 to their targeted work function levels.

As discussed supra, the work function of the PMOS transistor 60 and the NMOS transistor 70 is created using different dopants; therefore, the work function adjustment implant is performed on the PMOS transistor 60 and the NMOS transistor 70 in separate steps. In the example application the work function of the PMOS transistor is adjusted first. A standard photoresist process is used to form a first layer of photoresist over the semiconductor wafer 10 and then the photoresist layer is patterned and developed to form a first patterned photoresist layer 260, as shown in FIG. 2K. The first patterned photoresist layer 260 simultaneously protects the NMOS transistor 70 (thereby protecting the partially silicided gate electrode 113 of the NMOS transistor 70) while exposing the PMOS transistor 60.

The PMOS work function adjustment implant is now performed on the exposed region containing the PMOS transistor 60. Specifically, p-type dopants 270 such as B, Al, Ga, In, or Tl are implanted into the exposed partially silicided gate electrode of the PMOS transistor 60, as shown in FIG. 2L. In the example application, B is implanted into the partially silicided gate electrode 113 with a standard high current implanter (such as the high current implanters sold by Varian or Axcellis) to create a doped partially silicided gate electrode 112 of the PMOS transistor 60. Any suitable process parameters may be used, such as a dose of $2\times10^{14}$ to $2\times10^{15}$ atoms/$cm^2$ and energy of 5 to 80 keV. In the example application, the PMOS transistor 60 now has a work function that is close to the band edge.

As shown in FIG. 2M, a standard ash and clean process is used to remove the first patterned photoresist 260 over the NMOS region, and now the work function adjustment implant process can be performed on the NMOS region. A standard photoresist process is used to form a second layer of photoresist over the semiconductor wafer 10 and then the photoresist layer is patterned and developed to form a second patterned photoresist layer 280, as shown in FIG. 2N. The second patterned photoresist layer 280 simultaneously protects the PMOS transistor 60 (and the doped partially silicided gate electrode 112 of the PMOS transistor) while exposing the NMOS transistor 70.

The NMOS work function adjustment implant is now performed on the NMOS transistor 70, as shown in FIG. 2O. Specifically, n-type dopants 290 such as Yb, Gd, Ce, Pr, Nd, Sm, Eu, Tb, Dy, Ho, Er, or Tm are implanted into the exposed partially silicided gate electrode 113 of the NMOS transistor 70 to create a doped partially silicided gate electrode 112. In the example application, Yb is implanted into the partially silicided gate electrode with a standard high current implanter (such as the high current implanters sold by Varian or Axcellis). Any suitable process parameters may be used, such as an implantation of Yb species at a dose of $1\times10^{14}$ to $5\times10^{15}$ atoms/$cm^2$ and energy of 15 to 30 keV. In the example application, the NMOS transistor 70 has a work function that is close to the band edge. A standard ash and clean process is now used to remove the second patterned photoresist 280 over the PMOS region, as shown in FIG. 2P.

It is within the scope of the invention to adjust the work function of the NMOS transistor 70 before adjusting the work function of the PMOS transistor 60. In this alternative embodiment, the steps that are shown in FIGS. 2A-2J and discussed above remain the same. As shown in FIG. 3A, the next step of the alternative embodiment is the formation of the first patterned photoresist layer 260 that simultaneously protects the PMOS transistor 60 (and the partially silicided gate electrode 113 of the PMOS transistor) while exposing the NMOS transistor 70.

Figure 3C:
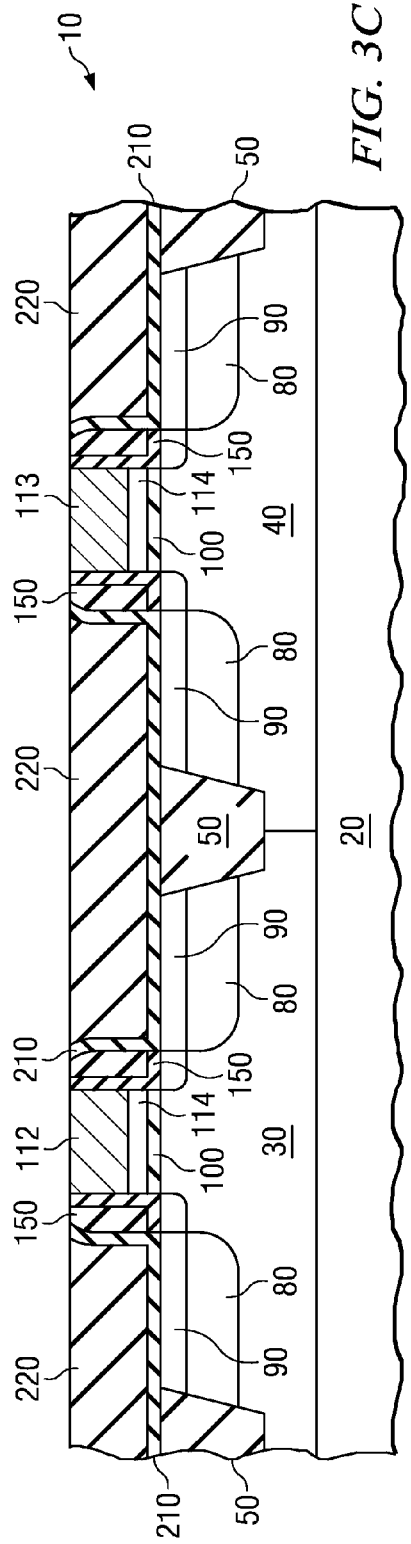

The NMOS work function adjustment implant is now performed on the exposed NMOS transistor 70, as shown in FIG. 3B. Specifically, n-type dopants 270 such as Yb, Gd, Ce, Pr, Nd, Sm, Eu, Tb, Dy, Ho, Er, or Tm are implanted into the exposed partially silicided gate electrode 113 of the NMOS transistor 70 to create a doped partially silicided gate electrode 112. In the example application, Yb is implanted into the partially silicided gate electrode with a standard high current implanter (such as the high current implanters sold by Varian or Axcellis). Any suitable process parameters may be used, such as an implantation of Yb species at a dose of $1\times10^{14}$ to $5\times10^{15}$ atoms/$cm^2$ and energy of 15 to 30 keV. In the example application, the NMOS transistor 70 has a work function that is close to the band edge. A standard ash and clean process is used to remove the first patterned photoresist 260 over the PMOS region, as shown in FIG. 3C.

Figure 3D:
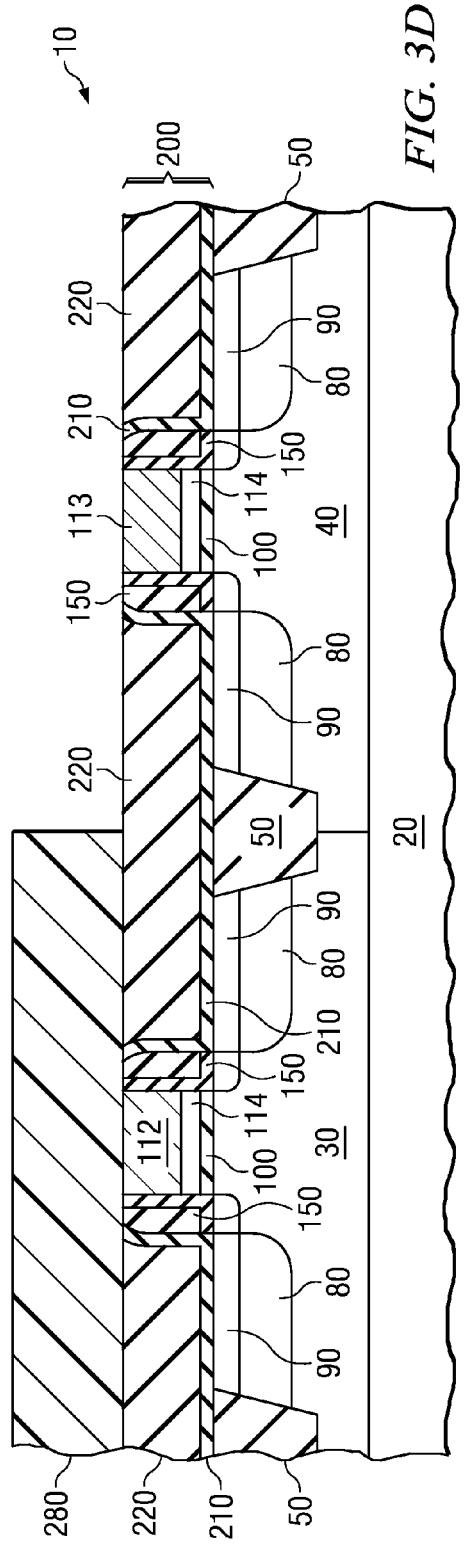

A standard photoresist process is now used to form a second layer of photoresist over the semiconductor wafer 10. The photoresist layer is patterned and developed to form a second patterned photoresist layer 280 that simultaneously protects the NMOS transistor 70 (thereby protecting the doped partially silicided gate electrode 112 of the NMOS transistor 70) while exposing the PMOS transistor 60, as shown in FIG. 3D.

The PMOS work function adjustment implant is now performed on the exposed PMOS transistor 60. Specifically, p-type dopants 290 such as B, Al, Ga, In, or Tl are implanted into the exposed partially silicided gate electrode 113 of the PMOS transistor 60, as shown in FIG. 3E. In the example application, B is implanted into the gate electrode with a standard high current implanter (such as the high current implanters sold by Varian or Axcellis) to create a doped partially silicided gate electrode 112 of the PMOS transistor 60. Any suitable process parameters may be used, such as a dose of $2\times10^{14}$ to $2\times10^{15}$ atoms/$cm^2$ and energy of 5 to 20 keV. In the example application, the PMOS transistor 60 now has a work function that is close to the band edge. A standard ash and clean process is now used to remove the second patterned photoresist 280 over the NMOS region 70, as shown in FIG. 3F.

The next step in the fabrication of the semiconductor wafer 10 (for both the example embodiment and the alternative embodiment described supra) is an optional work function implant anneal 300. If performed, the work function implant anneal 300 will activate the work function dopants to create doped partially silicided gate electrodes 111, as shown in FIG. 2Q.

As shown in FIG. 2R, a second silicide anneal 310 is now performed in order to fully react the doped partially silicided polysilicon gate electrode (i.e. either 112/114 of FIGS. 2P and 3F or 111/114 of FIG. 2Q). In the example application, the second silicide anneal 310 is a standard RTA process that is performed for 10-60 seconds at a temperature between 450-900° C. This second silicide anneal will compete the formation of the FUSI gate electrode 110 having the targeted work function in both the PMOS transistor 60 and the NMOS transistor 70, as shown in FIG. 2R. It is within the scope of the invention to use alternative processes for the second silicide anneal 310, such as a spike anneal process with a peak temperature in the range of 500-900° C. for 30-120 seconds. The fully silicided gate electrodes 110 will have a reduced resistivity because the second silicide anneal 310 will change the phase of the metal within the gate electrodes of the PMOS and NMOS transistors.

The semiconductor wafer is now prepared for further processing by removing the layer of insulating material 200 (i.e. the nitride layer 210 and the oxide layer 220). The layer of insulating material 200 may be removed using any suitable process, such as a wet clean (with dilute HF) or a defective dry etch process. As shown in FIG. 2S, the next step in the fabrication process may be the formation of the silicide layer 120 within the surface of the (now exposed) source/drain regions 80 using any suitable process.

Upon completion of the formation of source/drain suicides 120, the work function adjustment implants 270, 290, and the formation of the gate FUSI electrodes 110, the fabrication of the semiconductor wafer 10 now continues (using standard process steps) until the semiconductor device is complete. Generally, the next step is the formation of the dielectric insulator layer 160 using plasma-enhanced chemical vapor deposition ("PECVD") or another suitable process (see FIG. 1). The dielectric insulator 160 may be comprised of any suitable material such as $SiO_2$ or OSG. (However, a dielectric liner may be formed over the semiconductor wafer 10 before the placement of the dielectric insulator 160.)

The contacts 170 are formed by etching the dielectric insulator layer 160 to expose the desired gate, source, or drain. The etched spaces are usually filled with a liner 180 to improve the electrical interface between the silicide and the contact 170. Then contacts 170 are formed within the liner 180; creating the electrical interconnections between various semiconductor components located within the semiconductor substrate 20.

As discussed above, the fabrication of the final integrated circuit continues with the fabrication of the back-end structure. Once the fabrication process is complete, the integrated circuit will be tested and then packaged.

Various additional modifications to the invention as described above are within the scope of the claimed invention. As an example, interfacial layers may be formed between any of the layers shown. In addition, any of the implant processes may be followed by a post ion implantation clean. Furthermore, an anneal process may be performed after any step in the above-described fabrication process. When used, the anneal process can improve the microstructure of materials and thereby improve the quality of the semiconductor structure. Additionally, if a metal other than Ni is used then higher temperatures may be required for the described anneal processes.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for making a fully silicided gate electrode of a NMOS transistor and a fully silicided gate electrode of a PMOS transistor on a semiconductor wafer, comprising:

forming said NMOS transistor and said PMOS transistor on said semiconductor wafer, said NMOS transistor and said PMOS transistor having an undoped polysilicon gate electrode and a hardmask over said undoped polysilicon gate electrode;

forming a layer of insulating material over said semiconductor wafer;

removing said hardmasks and a portion of said layer of insulating material;

forming a layer of silicidation metal over said semiconductor wafer;

performing a first silicide anneal to change said undoped polysilicon gate electrodes into partially silicided gate electrodes;

removing unreacted portions of said silicidation metal layer;

forming a first patterned photoresist layer to protect said partially silicided gate electrode of said NMOS transistor;

implanting dopants of a first type into said partially silicided gate electrode of said PMOS transistor;

removing said first patterned photoresist layer;

forming a second patterned photoresist layer to protect said partially silicided gate electrode of said PMOS transistor;

implanting dopants of a second type into said partially silicided gate electrode of said NMOS transistor;

removing said second patterned photoresist layer; and performing a second silicide anneal to change said doped partially silicided gate electrodes into fully silicided gate electrodes.

2. The method of claim 1 wherein said step of forming said layer of insulating material over said semiconductor wafer comprises:

forming a layer of silicon nitride over said semiconductor wafer; and forming a layer silicon oxide over said layer of silicon nitride.

3. The method of claim 1 wherein said step of removing said hardmasks and a portion of said layer of insulating material comprises:

performing a CMP; and performing a dry etch.

4. The method of claim 1 wherein said layer of silicidation metal includes Ni.

5. The method of claim 1 wherein said silicidation metal layer comprises a first layer containing Ni and a second layer containing TiN.

6. The method of claim 1 wherein said step of implanting dopants of a first type into said partially silicided gate electrode of said PMOS transistor changes the work function of said PMOS transistor.

7. The method of claim 1 wherein said dopants of a first type implanted into said partially silicided gate electrode of said PMOS transistor include B.

8. The method of claim 1 wherein said step of implanting dopants of a second type into said partially silicided gate electrode of said NMOS transistor changes the work function of said NMOS transistor.

9. The method of claim 1 wherein said dopants of a second type implanted into said partially silicided gate electrode of said NMOS transistor include Yb.

10. The method of claim 1 wherein said dopants of a second type implanted into said partially silicided gate electrode of said NMOS transistor include Sb.

11. The method of claim 1 further including the step of performing a work function anneal before said step of performing said second silicide anneal.

12. The method of claim 1 further comprising:
removing remaining portions of said layer of insulating material;
forming a silicide layer within a top surface of a source and a drain of said NMOS and PMOS transistors.

13. A method for making a fully silicided gate electrode of a NMOS transistor and a fully silicided gate electrode of a PMOS transistor on a semiconductor wafer, comprising:
forming said NMOS transistor and said PMOS transistor on said semiconductor wafer, said NMOS transistor and said PMOS transistor having an undoped polysilicon gate electrode and a hardmask over said undoped polysilicon gate electrode;
forming a layer of insulating material over said semiconductor wafer;
removing said hardmasks and a portion of said layer of insulating material;
forming a layer of silicidation metal over said semiconductor wafer;
performing a first silicide anneal to change said undoped polysilicon gate electrodes into partially silicided gate electrodes;
removing unreacted portions of said silicidation metal layer;
forming a first patterned photoresist layer to protect said partially silicided gate electrode of said PMOS transistor;
implanting dopants of a first type into said partially silicided gate electrode of said NMOS transistor;
removing said first patterned photoresist layer;
forming a second patterned photoresist layer to protect said partially silicided gate electrode of said NMOS transistor, after said step of removing said first patterned photoresist layer;
implanting dopants of a second type into said partially silicided gate electrode of said PMOS transistor;
removing said second patterned photoresist layer; and
performing a second silicide anneal to change said doped partially silicided gate electrodes into fully silicided gate electrodes.

14. The method of claim 13 wherein said step of forming said layer of insulating material over said semiconductor wafer comprises:
forming a layer of silicon nitride over said semiconductor wafer; and
forming a layer silicon oxide over said layer of silicon nitride.

15. The method of claim 13 wherein said step of removing said hardmasks and a portion of said layer of insulating material comprises:
performing a CMP; and
performing a dry etch.

16. The method of claim 13 wherein said layer of silicidation metal includes Ni.

17. The method of claim 13 wherein said silicidation metal layer comprises a first layer containing Ni and a second layer containing TiN.

18. The method of claim 13 wherein said step of implanting dopants of a first type into said partially silicided gate electrode of said NMOS transistor changes the work function of said NMOS transistor.

19. The method of claim 13 wherein said dopants of a first type implanted into said partially silicided gate electrode of said NMOS transistor include Yb.

20. The method of claim 13 wherein said dopants of a first type implanted into said partially silicided gate electrode of said NMOS transistor include Sb.

21. The method of claim 13 wherein said step of implanting dopants of a second type into said partially silicided gate electrode of said PMOS transistor changes the work function of said PMOS transistor.

22. The method of claim 13 wherein said dopants of a second type implanted into said partially silicided gate electrode of said PMOS transistor include B.

23. The method of claim 13 further including the step of performing a work function anneal before said step of performing said second silicide anneal.

24. The method of claim 13 further comprising:
removing remaining portions of said layer of insulating material;
forming a silicide layer within a top surface of a source and a drain of said NMOS and PMOS transistors.

* * * * *